US007557016B2

(12) United States Patent
Kadoi

(10) Patent No.: US 7,557,016 B2
(45) Date of Patent: Jul. 7, 2009

(54) DICING METHOD USING AN ENCASED DICING BLADE SUBMERGED IN COOLING WATER

(75) Inventor: Kiyoaki Kadoi, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 11/699,794

(22) Filed: Jan. 30, 2007

(65) Prior Publication Data

US 2007/0175466 A1 Aug. 2, 2007

(30) Foreign Application Priority Data

Jan. 31, 2006 (JP) ............................ 2006-022739

(51) Int. Cl.
*B28D 1/04* (2006.01)
*H01L 21/301* (2006.01)
*H01L 21/78* (2006.01)

(52) U.S. Cl. .................................... 438/460; 125/13.01

(58) Field of Classification Search ............... 125/13.01
See application file for complete search history.

(56) References Cited

U.S. PATENT DOCUMENTS 6,253,757 B1 * 7/2001 Benson ........................ 125/35
2003/0045031 A1 * 3/2003 Kobayashi .................. 438/113
2004/0224483 A1 * 11/2004 Takyu et al. ................ 438/462

FOREIGN PATENT DOCUMENTS

JP 07-256479 * 10/1995

* cited by examiner

*Primary Examiner*—Hsien-ming Lee
*Assistant Examiner*—Walter H Swanson
(74) *Attorney, Agent, or Firm*—Adams & Wilks

(57) ABSTRACT

A dicing blade (2) which rotates at high speed is surrounded by a case (3). A semiconductor wafer (1) is cut by a dicing device in which the case is filled with a cooling water (4). The case (3) is provided with a cooling water nozzle (8) for continuously supplying the cooling water and a gap (10) for discharging the cooling water out of the case. By adjusting a supply rate and a discharge rate of the cooling water, a proper water pressure can be applied to an inside of the case, thereby making it possible to cool the dicing blade and the cutting point with efficiency. As a result, it is possible to suppress chipping and cracking of the semiconductor device due to lack of cooling.

18 Claims, 3 Drawing Sheets

Prior Art

DICING METHOD USING AN ENCASED DICING BLADE SUBMERGED IN COOLING WATER

BACKGROUND OF THE INVENTION

1. Field of the Invention

The present invention relates to a dicing machine and method enabling reduction of chipping and cracking both of which are caused during dicing a semiconductor wafer.

2. Description of the Related Art

Conventionally, a semiconductor device having a circuit formed on a semiconductor wafer is generally subjected to dicing using a dicing blade which rotates at high speed. However, in this method, heat generates when cutting the wafer by using the dicing blade, so during the dicing, the cutting is performed while supplying cooling water to a cutting portion to suppress the heat generation.

In the following, an example of a conventional dicing method will be described with reference to the drawings. FIG. 5 shows a conventional dicing method, and is a side view of a main portion of a dicing device. There are provided a semiconductor wafer 1, a dicing blade 2, a cooling water 4, a dicing tape 5, and a cooling water nozzle 8. The dicing blade 2 rotates at several tens of thousands rpm to cut the semiconductor wafer 1 which is an object to be machined. At this time, in order to eliminate the heat generated during the cutting, the wafer is cut while supplying the cooling water 4 to the blade. However, the cooling water is flung away from the rotating dicing blade due to a centrifugal force. Therefore, it is difficult to supply a sufficient amount of water to a cutting point. Thus, there is a problem in that chipping is caused in an end surface of the semiconductor device (semiconductor chip) after the dicing.

In order to solve the problem, there has been developed various dicing methods.

For example, JP 06-85054A discloses a technique of suppressing ruptures, chipping, and cracking caused at the time of dicing the wafer by providing a mechanism including a porous blade used as a dicing blade, for emitting pure water or air from an inside of the blade, to thereby prevent clogging of the blade.

JP 06-5700A discloses a dicing method in which the dicing blade is sandwiched from both sides thereof by flanges, and pure water is ejected from gaps between the dicing blade and the flanges. However, in this method, since the cooling water is directly supplied to the cutting point, an excessive force is exerted on the semiconductor chip, causing flapping of the semiconductor chip, and chipping occurs in the semiconductor chip.

JP 2000-349046 A discloses a method of supplying the cooling water in which a force to be applied to the semiconductor chip is devised to reduce the chipping.

JP 06-13460 A discloses a dicing method in which the cooling water nozzle is provided not only in the vicinity of the cutting portion but also on a blade outer peripheral surface, thereby elongating a life of the blade and keeping the chipping to a minimum.

SUMMARY OF THE INVENTION

As described above, for dicing a semiconductor device, there has been developed various methods of supplying the cooling water to the dicing blade in order to suppress heat generation caused by the dicing blade. However, those developments are not sufficient, so there are still caused chipping and cracking in the semiconductor device. It is therefore an object of the present invention to solve the above-mentioned problem.

In order to achieve the above-mentioned object, there is provided the following means. That is, (1) a dicing method characterized in that, in order to reliably supply a cooling water required for dicing a semiconductor wafer to a cutting portion, a dicing blade is surrounded by a case and an inside of the case is filled with the cooling water, thereby being capable of positively supplying water to the cutting portion at a time of dicing and of reducing chipping of the semiconductor device generated at the time of dicing; (2) a dicing method characterized in that a cooling water nozzle capable of continuously supplying the cooling water is attached to the case surrounding the dicing blade, and by enabling adjustment of a flow rate, a proper water pressure in the case can be ensured, thereby making it possible to sufficiently supply the cooling water to a cutting point; (3) a dicing method characterized in that a gap is formed between the case and the semiconductor wafer, and based on a gap size, a discharge rate of the cooling water to the outside of the case can be adjusted; (4) a dicing method characterized in that a brush is provided in the gap between the case and the semiconductor wafer, thereby reducing the discharge rate of the cooling water to ensure the proper water pressure in the case; (5) a dicing device, for cutting a semiconductor wafer with a dicing blade which rotates at high speed, characterized by including: the dicing blade; and a case surrounding the dicing blade and maintaining a gap between the semiconductor wafer and the case; and (6) a dicing device, for cutting a semiconductor wafer with a dicing blade which rotates at high speed, characterized by including: the dicing blade; a case surrounding the dicing blade and maintaining a gap between the semiconductor wafer and the case; and a brush provided in the gap.

According to the present invention, the cooling water can be sufficiently supplied over the entire dicing blade during cutting of the wafer, so the blade can be sufficiently cooled. Therefore, it is possible to achieve dicing which causes few numbers of chipping and cracking in the semiconductor device on the semiconductor chip. That is, a high-quality semiconductor device can be supplied in a stable manner.

DETAILED DESCRIPTION OF THE INVENTION

Hereinafter, preferred embodiments of the present invention will be described with reference to the drawings.

Embodiment 1

Figure 1:
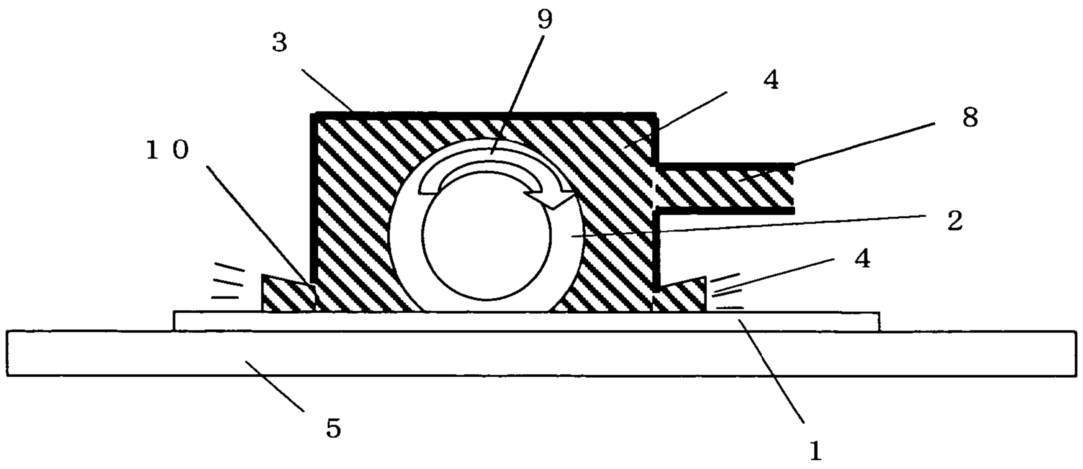
FIG. 1 is a blade side view showing a dicing method according to a first embodiment of the present invention.
Figure 2:
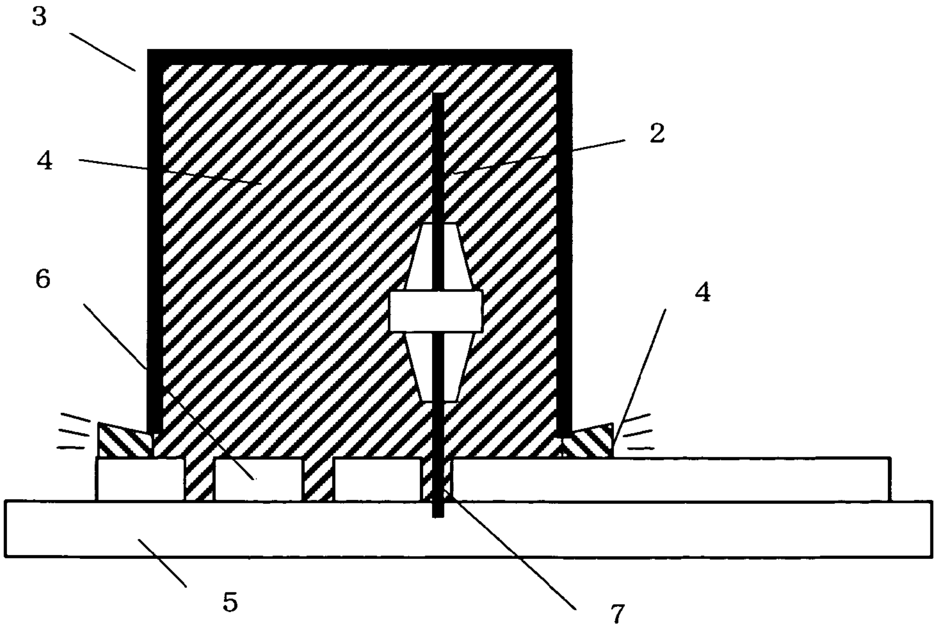
FIG. 2 is a blade front view showing the dicing method according to the first embodiment of the present invention.

A dicing method according to a first embodiment of the present invention will be described with reference to FIGS. 1 and 2. FIG. 1 is a side view of a dicing device main portion including a dicing blade. FIG. 2 is an enlarged front view of the main portion. A semiconductor wafer 1 is bonded to a dicing tape 5 and is held on a wafer stage portion (not shown) of the dicing device. The semiconductor wafer 1 which is held is cut due to a rotation 9 of a dicing blade 2, to thereby provide individual semiconductor chips 6. As shown, the dicing blade is surrounded and encased by a case 3 filled with a liquid cooling medium in the form of cooling water 4 and is entirely submerged in the cooling water 4 except for the lower peripheral portion of the dicing blade 2 that protects outward from a bottom of the case 3. In FIGS. 1 and 2, the case 3 surrounds the dicing blade 2 with five flat surfaces of the case 3, including an upper surface, two front surfaces, and two side surfaces. As long as only a bottom surface facing the semiconductor wafer is opened, the case may have a spherical surface. The cooling water 4 in the case 3 is supplied from a cooling water nozzle 8 and passes through the case 3 to be used for cooling the dicing blade 2 and a cutting point 7. After that, the cooling water 4 is discharged from a gap 10 between the semiconductor wafer 1 and the case 3 to outside of the case 3 together with cutting powder produced during cutting of the wafer. By adjusting an amount of water continuously supplied from the cooling water nozzle 8 into the case 3, a proper prescribed pressure is applied to the inside of the case 3, thereby sufficiently supplying the cooling water to the cutting point and the vicinity thereof. As a result, lack of cooling at the cutting point which has conventionally been the problem is solved. Further, a wide region including the cutting point is in the water, so the excessive force is not applied only to the cutting point. Therefore, there does not occur flapping of the semiconductor chip due to increase in the amount of water, which has been a problem with the conventional technique. Further, with this construction, the dicing blade as a whole is always cooled, so a cooling effect is extremely high.

Embodiment 2

Figure 3:
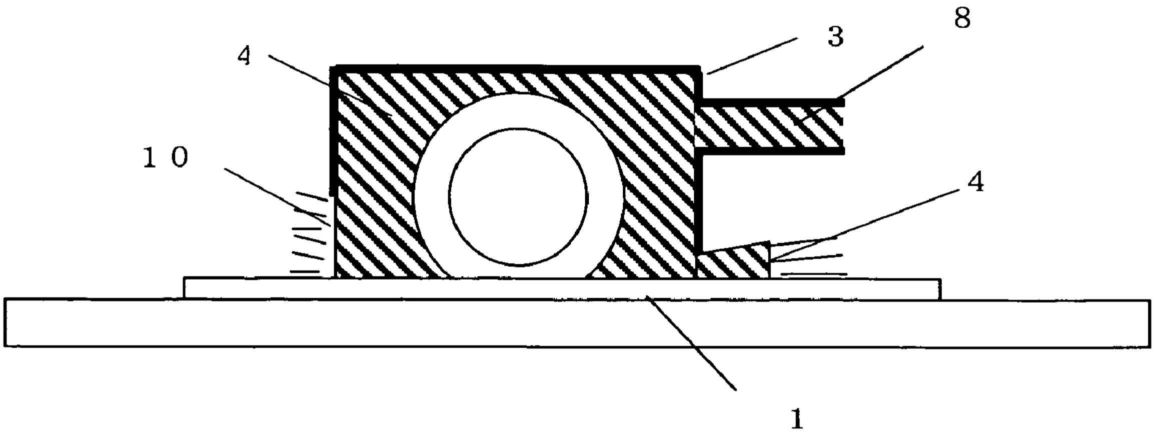
FIG. 3 is a blade side view showing a dicing method according to a second embodiment of the present invention.

FIG. 3 shows a second embodiment of the present invention. The accumulation of cutting powder around the cutting point accelerates heat generation, leading to the decrease of cutting performance, which causes chipping and cracking in the semiconductor chip. Prompt dispersion of the cutting powder generated by cutting the wafer into the cooling water to be discharged out of the case is thus desirable. In order to achieve this, a size of the gap 10 between the surface of the semiconductor wafer 1 and the case 3 is adjusted, thereby making it possible to rapidly discharge the cooling water 4 including the cutting powder to the outside of the case. A large opening in the gap 10 increases the discharge rate of the cooling water and the cutting powder, enabling the cutting in the cooling water of a high degree of purity. On the other hand, a small opening in the gap 10 assures the proper water pressure in the case 3, thereby making it possible to promote the cooling of the dicing plate and the cutting point. The water pressure in the case is determined according to states of supply and discharge of the cooling water. Therefore, when the opening degree is so high that the water pressure in the case is reduced and the cooling ability is insufficient, the insufficiency of the cooling ability may be compensated with increasing the supply rate of the cooling water from the cooling water nozzle 8.

Embodiment 3

Figure 4:
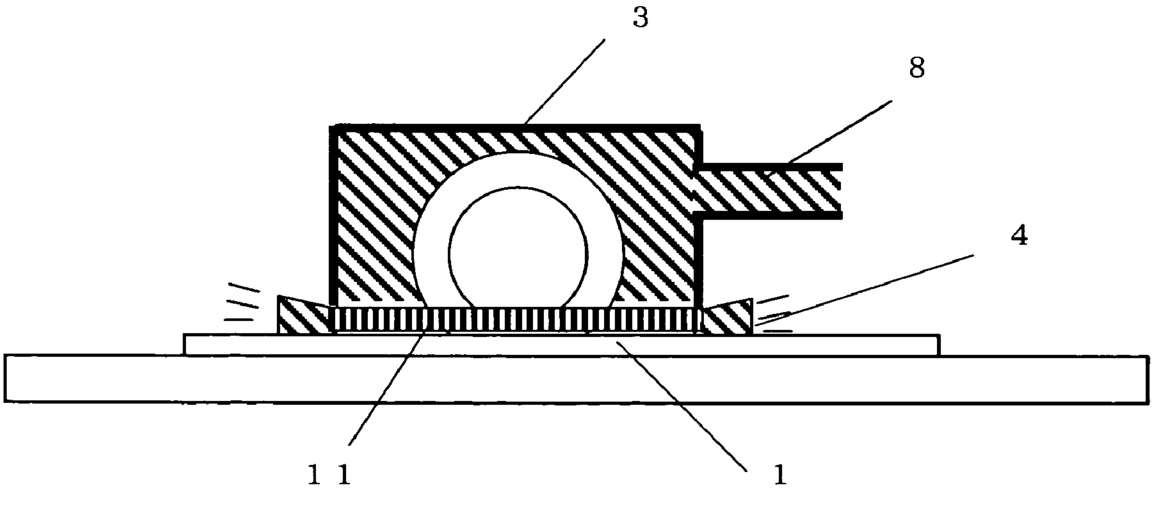
FIG. 4 is a blade side view showing a dicing method according to a third embodiment of the present invention.
Figure 5:
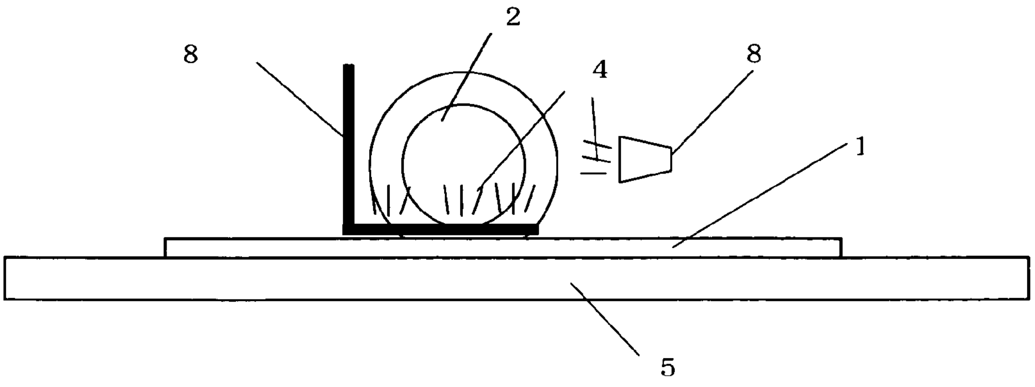
FIG. 5 is a blade side view showing a conventional dicing method.

FIG. 4 shows a third embodiment of the present invention. A brush 11 is provided in a gap between the surface of the semiconductor wafer 1 and the case 3, thereby reducing the discharge rate of the cooling water discharged from the gap and ensuring a water pressure in the case to allow the cooling water to be sufficiently supplied to the cutting point. Note that, it is preferable that a tip of the brush does not come into contact with the surface of the wafer and a slight space is maintained therebetween.

What is claimed is:

1. A dicing method of cutting a semiconductor wafer by a dicing blade which rotates at high speed, the dicing method comprising:

surrounding all but a lower peripheral portion of the dicing blade by a case;

filling an inside of the case with a cooling water so that the entire dicing blade except for the lower peripheral portion thereof is submerged in the cooling water; and cutting the wafer with the dicing blade while cooling the dicing blade and a cutting point with the cooling water.

2. A dicing method according to claim 1; wherein, in the step of cutting the wafer, the wafer is cut while cooling the dicing blade and the cutting point with the cooling water by adjusting a supply rate of the cooling water by a cooling water nozzle attached to the case and capable of continuously supplying the cooling water, to thereby ensure a proper water pressure in the case.

3. A dicing method according to claim 1; wherein, in the step of cutting the wafer, the wafer is cut while cooling the dicing blade and the cutting point with the cooling water by adjusting a discharge rate of the cooling water to outside of the case according to a size of a gap formed between the case and the semiconductor wafer, to thereby ensure the proper water pressure in the case.

4. A dicing method according to claim 3; wherein, in the step of cutting the wafer, the wafer is cut while cooling the dicing blade and the cutting point with the cooling water by reducing the discharge rate of the cooling water by a brush provided in the gap, to thereby ensure the proper water pressure in the case.

5. A method of dicing a semiconductor water using a rotationally driven dicing blade, comprising the steps:

encasing the dicing blade in a case with a lower peripheral portion of the dicing blade projecting outward from a bottom of the case;

filling the case with a liquid cooling medium so that the entire dicing blade except for the lower peripheral portion thereof that projects outward from the case bottom is submerged in the cooling medium; and dicing the semiconductor wafer with the dicing blade while the dicing blade is submerged in the cooling medium.

6. A method according to claim 5; wherein the case has an open bottom and is disposed over the semiconductor wafer so that the semiconductor wafer closes the open bottom of the case.

7. A method according to claim 6; further including the step of discharging the cooling medium from the case; and wherein the filling and discharging steps are carried out so as to maintain a prescribed pressure of the cooling medium in the case during dicing of the semiconductor wafer.

8. A method according to claim 7; wherein the case is disposed over the semiconductor wafer with a gap therebetween; and wherein the discharging step includes discharging the cooling medium from the case through the gap.

9. A method according to claim 8; wherein a brush is disposed in the gap to reduce the discharge rate of the cooling medium from the case.

10. A method according to claim 8; wherein the liquid cooling medium is water.

11. A method according to claim 5; further including the step of discharging the cooling medium from the case; and wherein the filling and discharging steps are carried out so as to maintain a prescribed pressure of the cooling medium in the case during dicing of the semiconductor wafer.

12. A method according to claim 11; wherein the case is disposed over the semiconductor wafer with a gap therebetween; and wherein the discharging step includes discharging the cooling medium from the case through the gap.

13. A method according to claim 12; wherein a brush is disposed in the gap to reduce the discharge rate of the cooling medium from the case.

14. A method according to claim 12; wherein the liquid cooling medium is water.

15. A method according to claim 5; wherein the liquid cooling medium is water.

16. A method of dicing a semiconductor wafer, comprising the steps:

providing a rotationally driven dicing blade; and using the dicing blade to dice the semiconductor wafer while the entire dicing blade except for a lower peripheral portion thereof is submerged in a liquid cooling medium.

17. A method according to claim 16; wherein the using step is carried out with the dicing blade contained in a case filled with the cooling medium.

18. A method according to claim 17; wherein the liquid cooling medium is water.

* * * * *